(12) United States Patent
Zang et al.

(10) Patent No.: US 12,162,796 B2
(45) Date of Patent: Dec. 10, 2024

(54) SUBSTRATE PROCESSING SYSTEM FOR PROCESSING OF A PLURALITY OF SUBSTRATES AND METHOD OF PROCESSING A SUBSTRATE IN AN IN-LINE SUBSTRATE PROCESSING SYSTEM

(71) Applicant: Applied Materials, Inc., Santa Clara, CA (US)

(72) Inventors: Sebastian Gunther Zang, Grossostheim (DE); Jürgen Henrich, Limeshain (DE)

(73) Assignee: Applied Materials, Inc., Santa Clara, CA (US)

(*) Notice: Subject to any disclaimer, the term of this patent is extended or adjusted under 35 U.S.C. 154(b) by 112 days.

(21) Appl. No.: 17/629,192

(22) PCT Filed: Jul. 25, 2019

(86) PCT No.: PCT/EP2019/070113
§ 371 (c)(1),
(2) Date: Jan. 21, 2022

(87) PCT Pub. No.: WO2021/013361
PCT Pub. Date: Jan. 28, 2021

(65) Prior Publication Data
US 2022/0250971 A1 Aug. 11, 2022

(51) Int. Cl.
*C03C 17/28* (2006.01)
*C03C 17/00* (2006.01)
*C23C 14/04* (2006.01)

(52) U.S. Cl.
CPC ............ *C03C 17/28* (2013.01); *C03C 17/001* (2013.01); *C23C 14/042* (2013.01)

(58) Field of Classification Search
None
See application file for complete search history.

(56) References Cited

U.S. PATENT DOCUMENTS 8,881,677 B2 * 11/2014 De .................. H01L 22/10
118/504
8,893,648 B2 * 11/2014 Tsunekawa ............ C25D 17/00
118/620

(Continued)

FOREIGN PATENT DOCUMENTS

CN 105917019 A 8/2016
JP 2000129442 A 5/2000

(Continued)

OTHER PUBLICATIONS

Korean Patent Application No. 10-2022-7005997, Office Action dated Apr. 3, 2024, 8 pages.

(Continued)

*Primary Examiner* — Jethro M. Pence
(74) *Attorney, Agent, or Firm* — Patterson + Sheridan, LLP

(57) ABSTRACT

A substrate processing system for processing of a plurality of substrates is described. The system includes a first deposition module being a first in-line module and having a first plurality of vacuum deposition sources; a second deposition module being a second in-line module and having a second plurality of vacuum deposition sources; and a glass handling module between the first deposition module and the second deposition module.

12 Claims, 7 Drawing Sheets

(56) References Cited

U.S. PATENT DOCUMENTS

| | | | |
|---|---|---|---|
| 9,211,563 B2 * | 12/2015 | Koparal | H01L 21/67712 |
| 9,310,655 B2 * | 4/2016 | Kim | H01L 21/67213 |
| 10,710,111 B2 * | 7/2020 | She | B05C 5/0241 |
| 2009/0226610 A1 | 9/2009 | Koenig et al. | |
| 2020/0243768 A1 * | 7/2020 | Zang | H01L 21/67715 |

FOREIGN PATENT DOCUMENTS

| | | |
|---|---|---|
| KR | 20100132517 A | 12/2010 |
| WO | 2010000503 A1 | 1/2010 |
| WO | 2018166622 A1 | 9/2018 |
| WO | 2018197010 A1 | 11/2018 |

OTHER PUBLICATIONS

International Search Report and Written Opinion for Application No. PCT/EP2019/070113 dated Apr. 30, 2020.
Chinese Application No. 2019800985589, Office Action and Search Report dated Dec. 15, 2023, 16 pages.

* cited by examiner

SUBSTRATE PROCESSING SYSTEM FOR PROCESSING OF A PLURALITY OF SUBSTRATES AND METHOD OF PROCESSING A SUBSTRATE IN AN IN-LINE SUBSTRATE PROCESSING SYSTEM

TECHNICAL FIELD

Embodiments of the present disclosure relate to an in-line substrate processing system. Further, embodiments of the present disclosure relate to a system and a method to evaporate an OLED layer stack in a vertical orientation, particularly to evaporate a one-colored OLED layer stack, such as a white OLED layer stack, in a vertical orientation. Embodiments of the present disclosure particularly relate to a substrate processing system for processing of a plurality of substrates, such as a substrate processing system for processing of a plurality of large area substrates in an essentially vertical orientation, a method of processing a substrate in an in-line substrate processing system, a vacuum orientation module for a substrate processing system, method of transporting a large area substrate in a substrate processing system, and method of manufacturing a layer stack of a display on a large area substrate.

BACKGROUND

Organic light-emitting diodes (OLED) are a special type of light-emitting diode in which the emissive layer includes a thin-film of certain organic compounds. OLEDs are used in the manufacture of television screens, computer monitors, mobile phones, other hand-held devices, etc. for displaying information. OLEDs can also be used for general space illumination. The range of colors and brightness possible with OLED displays is greater than that of traditional LCD displays because OLED material directly emits light. The energy consumption of OLED displays is considerably less than that of traditional LCD displays.

Further, the fact that OLEDs can be manufactured onto flexible substrates results in further applications. An OLED display may include, for example, layers of organic material situated between two electrodes, for example electrodes from a metallic material. The OLED is typically placed between two glass panels, and the edges of the glass panels are sealed to encapsulate the OLED therein. Alternatively, the OLED can be encapsulated with thin film technology, e.g. with a barrier film.

A process to manufacture OLED displays includes thermal evaporation of organic materials and deposition of organic materials on a substrate in a high vacuum. It is beneficial to complement this process with the use of a mask in order to block substrate areas from being coated and/or to pattern the organic layers onto the substrate during deposition. Herein, the mask is held close to the substrate during deposition of the organic layers and the substrate is typically arranged behind the mask during deposition and aligned relative to the mask.

FIG. 1 describes an exemplary system 10 for generating an organic display that may be used according to an industry standard horizontal in-line processing system. Substrates, such as glass substrates for display industry are processed in a horizontal orientation and enter the system 10 in a tab with the site to be processed facing upwards. In a flip chamber 12, the substrates are rotated by 180° to have the substrate surface to be processed facing downwardly. A substrate is transferred through a transfer module to one of a plurality of alignment chambers 16, wherein a mask for masking one or more organic deposition processes is provided over the substrate. In an acceleration module 18 the horizontally oriented substrates are accelerated to move through the plurality of organic deposition chambers 22, wherein organic layers are deposited from below the substrate. After the deceleration module 23, the mask is detached in one of a plurality of detachment chambers 26. The masks aligned on the substrate in the alignment chambers 16 and detached from the substrates in the detachment chambers 26 are transferred on a mask return path 72, typically under atmospheric conditions. Load lock chambers may be provided at the beginning and the end of the mask return path 72.

The substrate processed with organic layers in the above described organic module is transferred in a transfer module 32 to a metallic module. The metallic module includes alignment chambers 42, acceleration module 44, metal deposition chambers 46, deceleration module 47, and detachment chambers 49. The substrate handling in the metallic module corresponds to the above described organic module. After processing of the substrate, the substrate can be rotated by 180° in a second further chamber 62 and transferred out of the system 10 with a transfer module 66. Similar to the organic module, also the metallic module includes a mask return path 72. Yet further, a carrier supporting the substrate during processing of the substrate can be returned to the front end of the system 10 on a carrier return path 74, typically under atmospheric conditions.

The length 50 of the system 10 is inter alia determined by the number of organic deposition chambers and the number of metallic deposition chambers, wherein the system architecture for a deposition process having a plurality of organic layers below a plurality of metallic layers in combination with a re-using of a mask for the organic process and a different mask for the metallic process as well as a re-using of the carriers result essentially in a linear arrangement. Further, the width 90 of the system is inter alia determined by the horizontal substrate orientation, the mask return path and the carrier return path.

Considering a tendency towards larger substrate sizes for display manufacturing, it is beneficial to provide an improved system and improved method for depositing an organic layer stack, and particularly for depositing an organic layer stack and a metallic layer stack over the organic layer stack.

SUMMARY

In light of the above, a substrate processing system for processing of a plurality of substrates, a substrate processing system for processing of a plurality of large area substrates in an essentially vertical orientation, and a method of processing a substrate in an in-line substrate processing system are provided. Further aspects, embodiments, features and details can be derived from the dependent claims, the drawings and the specification.

According to one aspect, a substrate processing system for processing of a plurality of substrates is provided. The system includes a first deposition module being a first in-line module and having a first plurality of vacuum deposition sources; a second deposition module being a second in-line module and having a second plurality of vacuum deposition sources; and a glass handling module between the first deposition module and the second deposition module.

According to one aspect, a substrate processing system for processing of a plurality of large area substrates in an essentially vertical orientation is provided. The system includes at least a first load lock chamber; at least a first vacuum orientation chamber configured to move the large area substrate between a non-vertical orientation and a non-horizontal orientation; at least a first mask handling module downstream from the at least first vacuum orientation chamber; a first portion of an organic deposition module downstream from the at least first mask handling module; at least a first vacuum rotation module downstream from the first portion of the organic deposition module; and a second portion of the organic deposition module downstream from the at least first vacuum rotation chamber, the at least first mask handling module being downstream from the second portion of the organic deposition module.

According to one aspect, a method of processing a substrate in an in-line substrate processing system is provided. The method includes moving the substrate through a first portion of a first deposition module being an in-line module from a first end of the first deposition module to a second end opposing the first end of the first deposition module; rotating the substrate at the second end of the first deposition module; moving the substrate along a second portion of the first deposition module from the second end of the first deposition module to the first end of the first deposition module; moving the substrate through a first portion of a second deposition module being an in-line module from a first end of the second deposition module and a second end, opposing the first end, of the second deposition module; rotating the substrate at the second end of the second deposition module; moving the substrate along a second portion of the second deposition module from the second end of the second deposition module to the first end of the second deposition module; and loading the substrate into the substrate processing system and unloading the substrate from the substrate processing system between the first deposition module and the second deposition module.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments and are described in the following.

DETAILED DESCRIPTION OF EMBODIMENTS

Reference will now be made in detail to the various embodiments, one or more examples of which are illustrated in the figures. Within the following description of the drawings, the same reference numbers refer to same components. Generally, only the differences with respect to individual embodiments are described. Each example is provided by way of explanation and is not meant as a limitation of the disclosure. Further, features illustrated or described as part of one embodiment can be used on or in conjunction with other embodiments to yield yet a further embodiment. It is intended that the description includes such modifications and variations.

A process to manufacture OLED displays can include thermal evaporation of organic materials and deposition of organic materials on a substrate in a high vacuum. Depending on the display technology, the use of a mask for patterning the organic layers onto the substrate during deposition may be provided. For example, a mask may be an edge exclusion mask masking the parameter of a glass substrate, such as the rectangular glass substrate, e.g. with an edge of a few millimeters. An edge exclusion mask may be utilized for manufacturing a single color OLED layer stack, such as a white layer stack. Other processes may utilize a pattern mask, such as a fine metal mask (FFM), wherein the mask provides a pixel pattern for display pixels on the substrate. For example, this may be used for RGB display manufacturing. Accordingly, OLED display manufacturing processes with the utilization of a mask may be complex, for instance, due to additional processes to be accomplished in order to transfer a mask. Further, as particle generation and contamination can deteriorate the OLED display manufacturing system and the resulting devices, particle generation and contamination is of importance. Similar considerations apply for carriers for substrates. In addition to the particle generation and contamination considerations, i.e. in combination with the particle and contamination considerations, the footprint of a substrate processing system is beneficially reduced, particularly for display manufacturing on large area substrates.

Embodiments of the present disclosure allow for a strongly reduced footprint of a substrate processing system for manufacturing an organic layer stack, and particular for manufacturing an organic layer stack and the metallic layer stack over the organic layer stack. Further, masks and carriers for a substrate remain under vacuum conditions during normal operation.

Figure 1:
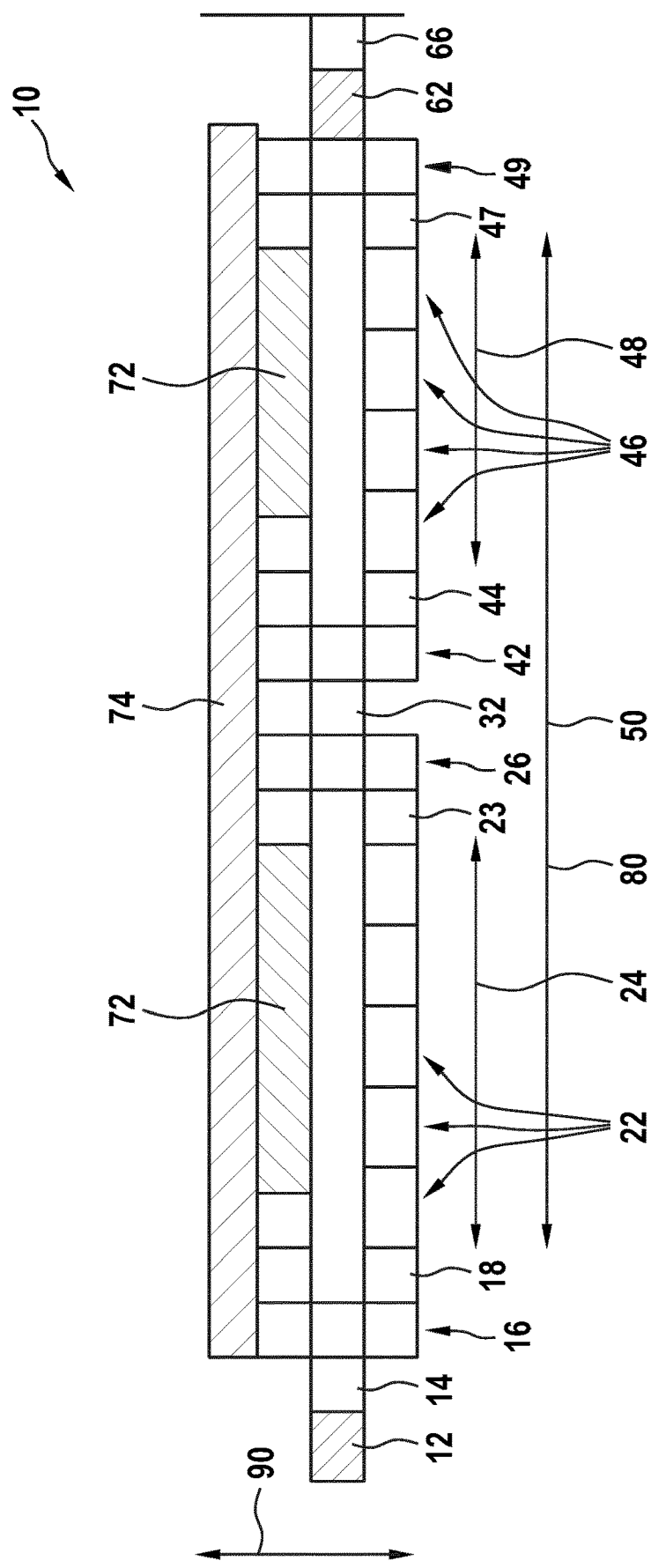
FIG. 1 shows a schematic top view of an industry standard horizontal in-line evaporation system according to the prior art.
Figure 2:
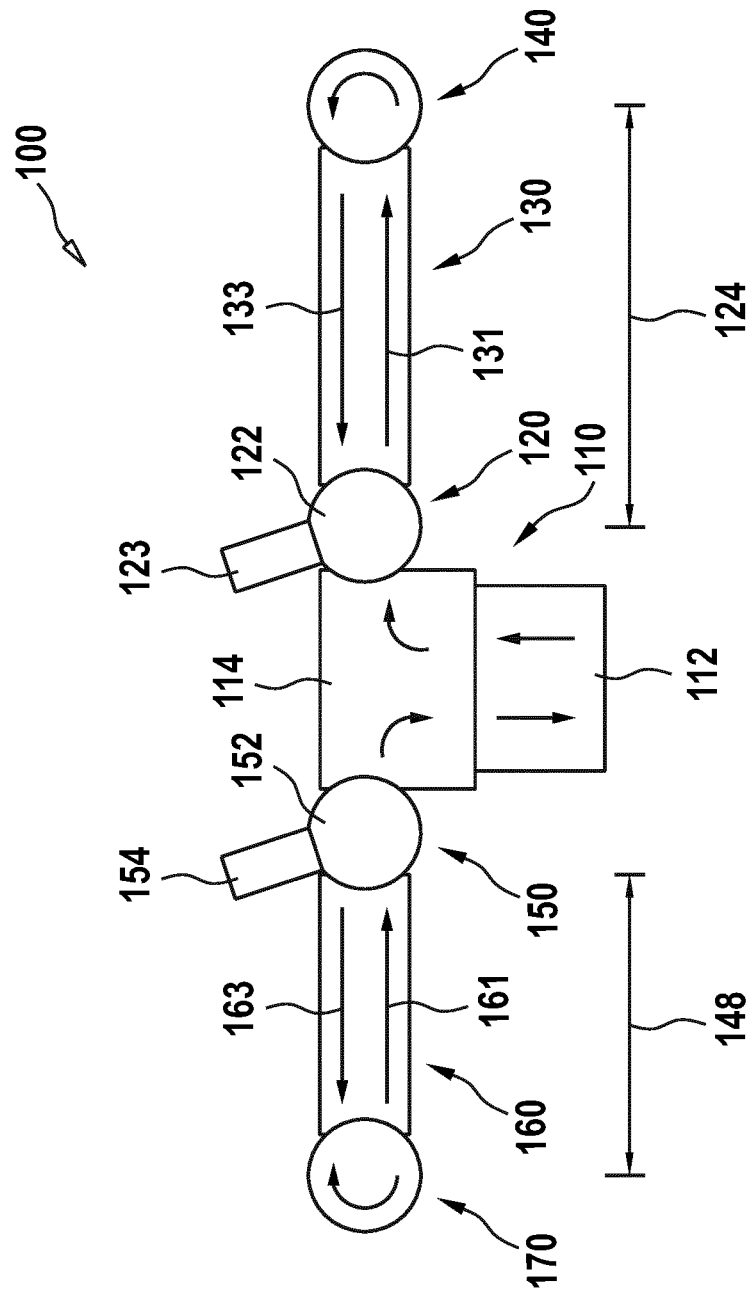
FIG. 2 shows a schematic top view of a vertical processing system according to embodiments of the present disclosure.

FIG. 2 shows a vacuum processing system 100. The vacuum processing system 100 shown in FIG. 2 includes an organic deposition module 130 and a metallic deposition module 160. The glass handling module 110 is provided between the organic deposition module 130 and the metallic deposition module 160. A first mask handling module 120 is provided between the glass handling module 110 and the organic deposition module 130. A second mask handling module 150 is provided between the glass handling module 110 and the metallic deposition module 160. Further, a first rotation module 140 is provided at the organic deposition module 130 at an end distal to the first mask handling module 120. A second rotation module 170 is provided at the metallic deposition module at an end distal to the second mask handling module 150.

In light of the above arrangement, substrates to be processed in the substrate processing system 100 are loaded at the glass handling module, for example, on substrate carriers, and are unloaded at the glass handling module 110, for example from substrate carriers. Accordingly, an empty carrier is provided after unloading of a process substrate at the same position, at which a new substrate is to be loaded on the empty carrier. Thus, transportation of empty carriers, for example, on a carrier return path can be avoided or reduced to a minimum. Further, exposure of a carrier to an atmospheric condition can be avoided or reduced to a minimum.

Further, the first rotation module 140 and the second rotation module 170 allow for "folding" the organic deposition path and the metallic deposition path, respectively. As exemplarily described with respect to the organic deposition module 130, the organic deposition module includes a forward transportation path 131 for depositing a first group of organic layers on the substrate and a backward transportation path 133 for depositing a second group of organic layers over the first group of organic layers. The substrate is rotated between the forward transportation path 131 and the backward transportation path 133 by the first rotation module 140. By "folding" the organic deposition path, the length 124 of the organic deposition module can be reduced, for example, by around 50%.

In combination with the advantage of reducing the length 124 of the organic deposition module and, thus, reducing the footprint in the length direction of the substrate processing system 100, a further advantage is provided by the arrangement. The first mask handling module 120 is provided at the start of the organic deposition path and (at the same time) at the end of the organic deposition path. Accordingly, a mask that has previously been utilized for a deposition process is removed from the processed substrate in the first mask handling module 120 and can be positioned on a new substrate to be processed in the first mask handling module 120. Accordingly, a used mask is provided after detaching the mask from the substrate at the same position or essentially at the same position, as described below, at which the mask is attached to a substrate. Thus, transportation of mask, for example, on a mask return path can be avoided or reduced to a minimum. Further, exposure of a mask to an atmospheric condition can be avoided or reduced to a minimum.

According to yet further embodiments, which can be combined with other embodiments described herein, the metallic deposition module includes a forward transportation path 163 for depositing a first group of metallic layers on the substrate and a backward transportation path 161 for depositing a second group of metallic layers over the first group of metallic layers. The substrate is rotated between the forward transportation path and the backward transportation path by the second rotation module 170. By "folding" the metallic deposition path, the length 148 of the metallic deposition module can be reduced, for example, by around 50%.

According to yet further features, details, aspects, and implementations of embodiments described herein, which can be combined with other embodiments described herein, the glass handling module 110 includes a vacuum orientation module 114 configured to change the substrate orientation from a non-vertical orientation, for example, a horizontal orientation to a non-horizontal orientation, for example, an essentially vertical orientation. Accordingly, the substrates can be processed and/or transported through the vacuum processing system 100 in an essentially vertical orientation. Accordingly, the footprint can be further reduced as compared to an industry standard horizontal in-line processing system. The glass handling module may include a load lock module 112. The load lock module 112 is configured to load substrates, for example, large area substrates for display manufacturing from an atmospheric condition into a vacuum and vice versa. For example, the substrates may be loaded into and unloaded from the load lock module in a horizontal orientation.

According to embodiments of the present disclosure, a combination of a plurality of advantages can be provided by the system arrangement. The length of the substrate processing system can be significantly reduced, for example, by around 50%, wherein the term "around" refers to the fact that one or two additional transfer chambers may be included, for example, in case of an uneven number of vacuum chambers in a processing path. The width of the substrate processing system can be significantly reduced, e.g. by an essentially vertical substrate orientation. A carrier return path and a mask return path can be avoided, which can particularly reduce contamination and further reduce the width of the substrate processing system.

Figure 3:
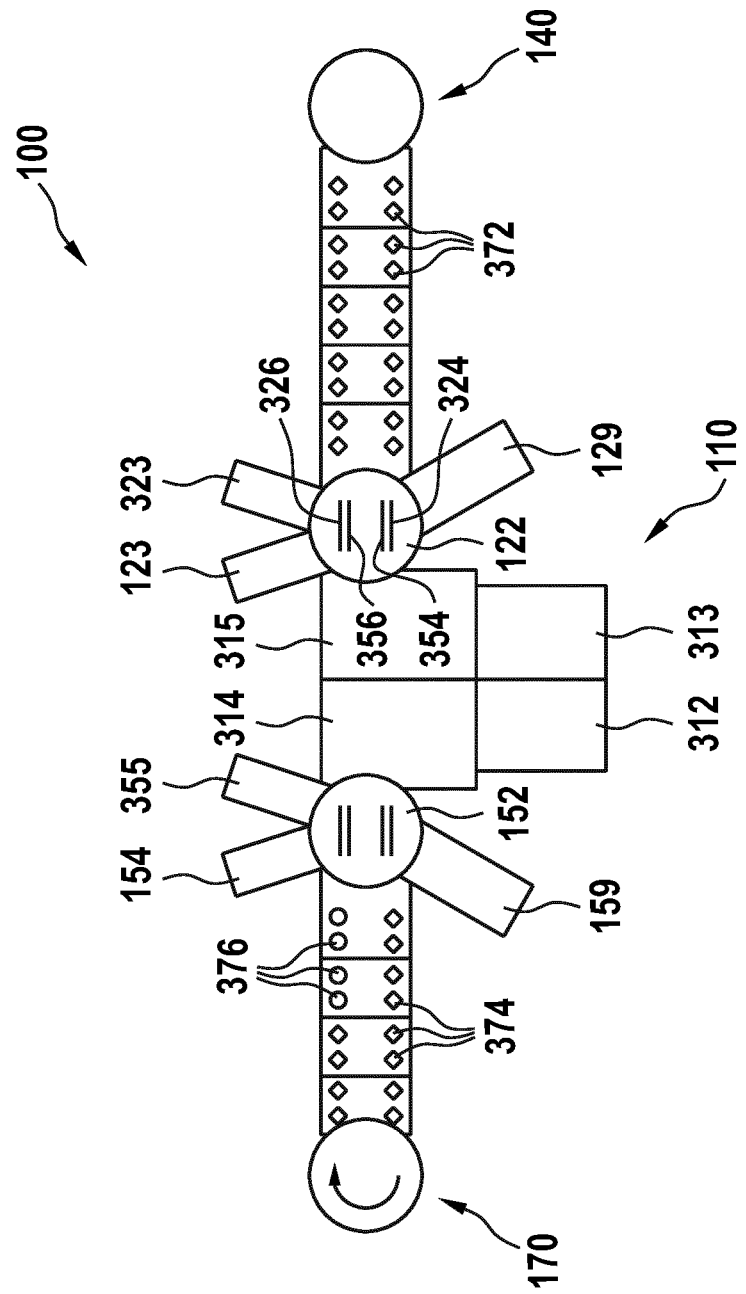
FIG. 3 shows a schematic top view of a further vertical processing system according to embodiments of the present disclosure.

As exemplarily shown in FIGS. 2 and 3, embodiments of the present disclosure include one or more mask handling modules for an in-line substrate processing system. For example, the first mask handling module 120 can be provided for the organic deposition path. Further, a second mask handling module 150 can be provided for the metallic deposition path. The mask handling modules may include similar details, features, and aspects and the first mask handling module 120 is exemplarily described.

The in-line substrate processing system can be a display manufacturing system or a part of a display manufacturing system, in particular an OLED display manufacturing system, and more particularly an OLED display manufacturing system for large area substrates. The transport of a mask or substrate carrier, i.e. the movement of a substrate carrier through the in-line substrate processing system can inter alia be provided in a vertically orientated state of the substrate carrier. For example, substrate carriers can be configured to hold a substrate, such as a glass plate, in a vertically orientated state or an essentially vertically orientated state.

With exemplary reference to FIGS. 2 and 3, the mask handling module 120 may include a vacuum rotation chamber 122. For example, the vacuum rotation chamber can be provided within the in-line substrate processing system and is provided between the glass handling module 110 and the organic deposition module 130. In particular, the vacuum rotation chamber 122 can be configured to provide vacuum conditions in the chamber. Further, the mask handling module 120 may include a rotation mechanism within the vacuum rotation chamber 122. The rotation mechanism may further include a rotating support. Furthermore, the rotation mechanism may also include an actuator configured to rotate the rotating support within the vacuum rotation chamber 122. Examples of an actuator may include an electric motor, a pneumatic actuator, an hydraulic actuator, and the like. In particular, the actuator may be configured for providing a rotation of at least 120° of the rotating support in a clockwise and/or an anti-clockwise direction. For example, the actuator may be configured for providing a rotation of 80°.

According to some embodiments, the mask handling module 120 may further include a first mask stage 324 and a second mask stage 326 (see for example FIG. 3). The first mask stage and the second mask stage each include a mask holder assembly to support the mask while not attached to a substrate or a substrate carrier, respectively. A first mask holder assembly and/or the second mask holder assembly may include at least one clamp of the group: an electromagnetic clamp, an electropermanent magnetic clamp, and a mechanical clamp.

The first mask stage 324 may be mounted to the rotation mechanism for rotation of the first mask stage. Further, the first mask stage may be mounted to the rotation support in a vertical orientation state. The term "mounted" refers to the state of being fixed or fastened to the rotation mechanism and/or to the rotating support by any fastening means e.g. through the use of a mechanical holder, an electromagnetic holder, and/or an electropermanent holder. According to yet further embodiments, which can be combined with other embodiments described herein, the second mask stage 326 may be provided similar to the first mask stage.

Further, the mask handling module 120 may particularly include at least one connecting flange configured for connecting at least one vacuum chamber and/or a transit module. Typically, some or all of the different types of connecting flanges have a casing frame-like structure which may be configured for providing vacuum conditions inside the casing frame-like structure.

According to some embodiments, the mask handling module 120 may also include a mask handling assembly. The mask handling assembly may be positioned in a mask handling chamber 123 or a further mask handling chamber 323 attached to the vacuum rotation chamber. In particular, the mask handling chamber or mask handling chambers can be configured to provide vacuum conditions in the chamber. A mask handling assembly may include a vacuum robot with one, two or more individually movable robot hands. Each robot hand may include a mask holding portion configured to grab or support a mask. Further, the mask holding portion may be configured to transfer a mask between the vacuum rotation chamber 122 and one or more mask holders (e.g. mask shelfs) in the mask handling chamber 123 or the further mask handling chamber 323. Furthermore, the one or more mask handling chambers can be configured to transfer a mask from the rotation mechanism, e.g. from the first mask stage 324 or from the second mask stage 326. Furthermore, the one or more mask handling chambers can be configured to transfer a mask to the rotation mechanism, e.g. to the first mask stage or to the second mask stage.

According to some embodiments, a mask handling assembly in the mask handling chamber 123 or the mask handling chamber 323 may be configured for a first mask transfer between the first mask stage 324 and the respective mask handling chamber. For instance, the mask handling chamber 123, in particular the mask handling assembly, can be configured for loading the mask to the first mask stage. Further, the mask handling chamber, in particular the mask handling assembly, can be configured to separate the mask from the first mask stage.

According to some embodiments, the mask handling module 120 may further include a first substrate transportation track 354 associated with the first mask stage 324. The first substrate transportation track may be configured to support the first substrate carrier. Accordingly, the first mask holder assembly may be configured for a second mask transfer between the first mask stage 324 and the first substrate carrier. For instance, the mask may be loaded or transferred from the first mask stage to the first substrate carrier. Additionally, the mask handling module 120 may also include a second substrate transportation track 356 associated with the second mask stage 326. The second substrate transportation track may be configured to support a second substrate carrier.

After deposition of material on a substrate through a mask, the mask may be carried back to the mask handling module 120, for example, to the first mask stage or to the second mask stage by a first substrate carrier or a second substrate carrier, respectively. Thereafter, for example, a third mask transfer between the second mask stage 326 and the mask handling chamber 123 may be conducted. Accordingly, the second mask holder assembly may be configured for a third mask transfer between the second mask stage 326 and the mask handling chamber 123. For instance, the mask may be transferred to the mask handling chamber, in particular to the mask handling assembly, e.g. for cleaning.

According to some embodiments, a substrate transportation track can be configured for contactless transportation of a substrate carrier. For example, the substrate transportation track can be a first substrate transportation track 354 and/or a second substrate transportation track 356.

According to some embodiments, which can be combined with other embodiments described herein, the first mask handling module 120 may include one or more mask handling chambers, for example, mask handling chamber 123 and mask handling chamber 323. The mask handling chambers are coupled to the vacuum rotation chamber 122. Similarly, the second mask handling module 150 may include one or more mask handling chambers, for example, mask handling chamber 154 and mask handling chamber 354. The mask handling chambers are coupled to the vacuum rotation chamber 152. According to yet further optional modifications, a substrate carrier buffer chamber 129 can be coupled to the vacuum rotation chamber 122. Additionally or alternatively, a substrate carrier buffer chamber 159 can be coupled to the vacuum rotation chamber 152. Substrate carriers can be loaded from the one or more substrate carrier buffer chambers into the substrate processing system 100, i.e. into one of the deposition modules, via the one or more vacuum rotation chambers.

According to some embodiments of the present disclosure, a substrate processing system 100 is provided wherein the first deposition module, for example, an organic deposition module is provided with a first portion in one direction and the second portion in an opposite direction. The vacuum rotation chamber, i.e. the first rotation module 140, is provided to move the substrate or a carrier supporting the substrate from the first portion to the second portion. Accordingly, the first deposition module is "folded". The mask handling module 120 is provided at the start of the first deposition module and simultaneously at the end of the first deposition module. The mask is unloaded in the vacuum rotation chamber 122. The unloaded mask is loaded on a substrate or a substrate carrier, respectively in the vacuum rotation chamber 122, i.e. the same vacuum rotation chamber. Accordingly, an improved mask transfer is provided and/or a separate mask return path can be avoided. Accordingly, contamination of a mask in the substrate processing system 100 can be reduced. The substrate processing system 100 is further configured to provide the above-mentioned advantages for both an organic deposition module and the metallic deposition module, i.e. the first deposition module and a second deposition module.

Due to the design of the substrate processing system, the substrate handling module or glass handling module 110 is provided close to the start of the first deposition module and close to the end of the first deposition module. Accordingly, an improved substrate carrier transfer is provided and/or a substrate carrier return path can be avoided. Accordingly, contamination of the substrate carrier and the substrate processing system 100 can be reduced. Yet further, the substrate handling module is provided between a first deposition module and the second deposition module. Accordingly, the above-mentioned advantages can also be utilized for a substrate processing system having a first deposition module and the second deposition module, such as an organic deposition module and a metallic deposition module.

FIG. 3 further illustrates deposition sources in the vacuum chambers of the deposition modules. For example, organic deposition sources 372 can be provided in vacuum chambers of the organic deposition module. According to some embodiments, which can be combined with other embodiments described herein, the organic deposition sources can be evaporation sources, and particularly line sources extending essentially vertically. Organic material can be deposited on a substrate, for example, while the substrate moves past an organic deposition source 372 providing a line source. Yet further, one or more metallic deposition sources 374 and/or one or more metallic deposition sources 376 can be provided in the metallic deposition module. According to some embodiments, which can be combined with other embodiments described herein, the metallic deposition sources can be evaporation sources or sputter sources, and particularly can be line sources extending essentially vertically.

According to some embodiments, which can be combined with other embodiments described herein, a deposition module, for example, the first deposition module or the second deposition module can be provided with one or more vacuum chambers. The deposition module has a first portion with a transportation path in one direction and the second portion with a transportation path in an opposite direction. The first portion and the second portion can be separated by a separation wall. According to some embodiments, which can be combined with other embodiments described herein, a deposition module can be provided at one vacuum system, i.e. an arrangement of chambers with or without a separation wall, therein the vacuum system is evacuated by one or more vacuum pump systems.

FIG. 3 further illustrates a glass handling module 110 according to some embodiments, which can be combined with other embodiments described herein. The glass handling module 110 includes a first load lock chamber 312 and a second load lock chamber 313. The glass handling module 110 further includes a first vacuum orientation chamber 314 and a second vacuum orientation chamber 315. Substrates to be processed in the substrate processing system 100 can be loaded at an atmospheric pressure into one of the load lock chambers. For example, substrates can be horizontally loaded into one of the load lock chambers. After loading, the respective load lock chamber can be evacuated and the substrate can be transferred in one of the vacuum orientation chambers. In the vacuum orientation chamber, the substrate orientation can be changed from the non-vertical orientation, for example, the horizontal orientation, to the non-horizontal orientation, for example, a vertical orientation or an essentially vertical orientation.

According to some embodiments, which can be combined with other embodiments described herein, at least a first vacuum orientation chamber and a second vacuum orientation chamber can be provided. A load lock chamber can be provided for each of the vacuum orientation chambers. Providing two or more vacuum orientation chambers has the advantage of improving the tact time of the substrate processing system 100. For example, two or more load lock chambers and correspondingly two or more vacuum orientation chambers can be operated in a sequence and/or alternatingly. For example, one substrate can be loaded in the first load lock chamber and a first vacuum orientation chamber while another substrate is transported towards a deposition module from a second vacuum orientation chamber.

According to an embodiment of the present disclosure, a substrate processing system for processing of a plurality of substrates is provided. The substrate processing system includes a first deposition module being a first in-line module and having a first plurality of vacuum deposition sources and a second deposition module being a second in-line module and having a second plurality of vacuum deposition sources. A glass handling module is provided between the first deposition module and the second deposition module. According to some embodiments, the glass handling module may include a vacuum orientation module configured to change a substrate orientation from a non-vertical orientation to a non-horizontal orientation under vacuum. For example, the vacuum orientation module includes a first vacuum orientation chamber and a second vacuum orientation chamber. According to some embodiments, which can be combined with other embodiments described herein, the glass handling module may further include a load lock module for horizontally loading and unloading the glass substrates between an atmospheric region and vacuum in the substrate processing system.

According to some optional modifications of embodiments of the present disclosure, the substrate processing system may further include a first mask handling module between the glass handling module and the first deposition module and a second mask handling module between the glass handling module and the second deposition module. Particularly, at least one of the first mask handling module and the second mask handling module may provide a vacuum rotation chamber and a mask handling chamber connected to the vacuum rotation chamber. For example, the vacuum rotation chamber can include a first mask stage and a second mask stage, the vacuum rotation chamber being configured to exchange the position between the first mask stage and the second mask stage.

According to yet further embodiments, which can be combined with other embodiments described herein, particularly for "folding" the first deposition module and the second deposition module and for providing a mask handling module for masking and unmasking of a substrate, the substrate processing system may include at least one of a first vacuum rotation chamber provided at an end of the first deposition module distant to the glass handling module and a second vacuum rotation chamber provided at an end of the second deposition module distant to the glass handling module.

According to another embodiment, wherein features, details, aspects, and modifications may be combined with other embodiments described herein, a substrate processing system for processing a plurality of large area substrates in an essentially vertical orientation is provided. The substrate processing system includes at least a first load lock chamber, at least a first vacuum orientation chamber configured to move the large area substrate between a non-vertical orientation and a non-horizontal orientation, at least a first mask handling module downstream from the at least first vacuum orientation chamber, a first portion of an organic deposition module downstream from the at least first mask handling module, at least a first vacuum rotation module downstream from the first portion of the organic deposition module, and a second portion of the organic deposition module downstream from the at least first vacuum rotation chamber, the at least first mask handling module being downstream from the second portion of the organic deposition module. For example, the substrate processing system may further include a second mask handling module, wherein the at least first vacuum orientation chamber is provided between the at least first mask handling module and the second mask handling module, a first portion of metallic deposition module downstream from the second mask handling module, a second vacuum rotation module downstream from the first portion of the metallic deposition module, and a second portion of the metallic deposition module downstream from the second vacuum rotation chamber, the second mask handling module being downstream from the second portion of the metallic deposition module.

Figure 4:
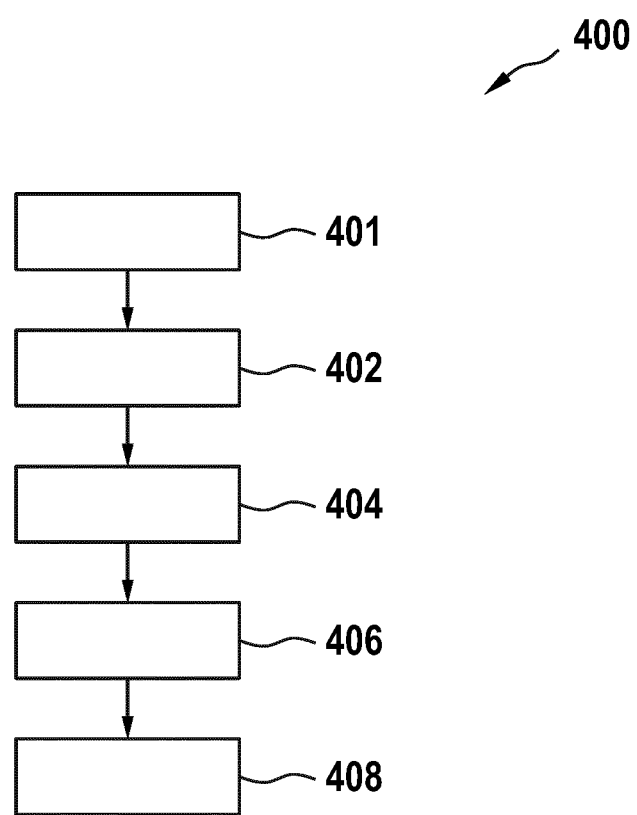
FIG. 4 shows a flowchart illustrating a method to manufacture an organic layer stack according to embodiments described herein.

FIG. 4 illustrates a method 400 of processing a substrate in an in-line substrate processing system or a method of manufacturing a display in an in-line substrate processing system. At operation 401, the substrate is moved through a first portion of a first deposition module being an in-line module from a first end of the first deposition module and a second end, opposing the first end, of the first deposition module. The substrate is rotated, for example, in the essentially vertical orientation, at the second end of the first deposition module (see operation 402). At operation 404, the substrate is moved along a second portion of the first deposition module from the second end of the first deposition module to the first end of the first deposition module. Similar to the movement through the first portion and the second portion of the first deposition module, the substrate can be moved through the first portion and a second portion according to operation 406. For example, the substrate is moved through a first portion of a second deposition module being an in-line module from a first end of the second deposition module and a second end, opposing the first end, of the second deposition module, is rotated at the second end of the second deposition module and is moved along a second portion of the second deposition module from the second end of the second deposition module to the first end of the second deposition module. At operation 408, the substrate is loaded into the substrate processing system and is unloaded from the substrate processing system between the first deposition module and the second deposition module. It is to be understood, that the substrate is loaded into the substrate processing system before moving the substrate in the first deposition module and the second deposition module and that the substrate is unloaded after moving the substrate in the first deposition module and the second deposition module. For example, the substrate may be moved through the substrate handling module from the first deposition module to the second deposition module, e.g. after processing in the first deposition module and before processing in the second deposition module.

According to some embodiments, which can be combined with other embodiments described herein, the substrate orientation is changed between a non-vertical orientation and a non-horizontal orientation. The vacuum orientation chamber for changing the substrate orientation is provided between the first deposition module and the second deposition module in the substrate handling module. Additionally or alternatively, a method of processing a substrate and/or manufacturing a display may include masking the substrate in a position between the first deposition module and the second deposition module in a mask handling module and unmasking the substrate in a position between the first deposition module and the second deposition module in the mask handling module. For example, the mask can be rotated after unmasking the substrate in the mask handling module to mask a further substrate. The rotated mask can be used to mask a further substrate. Accordingly, embodiments of the present disclosure provide the advantage to avoid a mask return path and, thus, to reduce the footprint of a substrate processing system.

According to embodiments of the present disclosure, the masking concept providing unmasking and masking in the same mask handling module can be provided for the first deposition module, for example, an organic deposition module and the second deposition module, for example, a metallic deposition module. Accordingly, for manufacturing of one or more organic displays, an organic deposition path and a metallic deposition path each provide a mask handling module according to embodiments of the present disclosure. Accordingly, different masks for organic deposition and metallic deposition can be provided. For both the organic deposition and the metallic deposition, the advantageous masking concept can be provided for embodiments described herein.

Embodiments of the present disclosure may refer to substrate transportation in a substrate processing system. According to embodiments of the present disclosure, a substrate can be processed in an essentially vertical orientation. Further, the substrate can be supported by a carrier and the carrier supporting the substrate can be transferred within the substrate processing system. For example, a carrier can be an electrostatic chuck configured to support large area substrates. Additionally or alternatively, the carrier can be configured to be levitated by a transportation system. Levitation refers to contactless or essentially contactless transportation of the carrier, for example, with magnetic levitation system.

According to some embodiments, which can be combined with other embodiments described herein, the substrate carriers can be configured for holding or supporting the substrate or the substrate and the mask in a substantially vertical orientation. Further, a mask stage can be configured for holding or supporting the mask in a substantially vertical orientation. As used throughout the present disclosure, "substantially vertical" is understood particularly when referring to the substrate orientation, to allow for a deviation from the vertical direction or orientation of ±20° or below, e.g. of ±10° or below. This deviation can be provided for example because a substrate support with some deviation from the vertical orientation might result in a more stable substrate position. Further, fewer particles reach the substrate surface when the substrate is tilted forward. Yet, the substrate orientation, e.g., during the deposition of materials, such as organic or metallic materials, on a substrate in a high vacuum, is considered substantially vertical, which is considered different from the horizontal substrate orientation, which may be considered as horizontal ±20° or below.

According to some embodiments, which can be combined with other embodiments described herein, a substrate carrier can be an electrostatic chuck (E-chuck) providing an electrostatic force for holding the substrate and optionally the mask at the substrate carrier, and particularly at the support surface. For example, the substrate carrier includes an electrode arrangement configured to provide an attracting force acting on the substrate.

The embodiments described herein can be utilized for deposition of materials, such as organic or metallic materials, on large area substrates, e.g., for OLED display manufacturing. Specifically, the substrates, for which the structures and methods according to embodiments described herein are provided, may be large area substrates. For instance, a large area substrate can be GEN 4.5, which corresponds to a surface area of about 0.67 m$^2$ (0.73 m×0.92 m), GEN 5, which corresponds to a surface area of about 1.4 m$^2$ (1.1 m×1.3 m), GEN 7.5, which corresponds to a surface area of about 4.29 m$^2$ (1.95 m×2.2 m), GEN 8.5, which corresponds to a surface area of about 5.7 m$^2$ (2.2 m×2.5 m), or even GEN 10, which corresponds to a surface area of about 8.7 m² (2.85 m×3.05 m). Even larger generations such as GEN 11 and GEN 12 and corresponding surface areas can similarly be implemented. Half sizes of the GEN generations may also be provided in OLED display manufacturing.

According to some embodiments, which can be combined with other embodiments described herein, the substrate thickness can be from 0.1 to 1.8 mm. The substrate thickness can be about 0.9 mm or below, such as 0.5 mm. The term "substrate" as used herein may particularly embrace substantially inflexible substrates, e.g., a glass plate or other substrates. However, the present disclosure is not limited thereto and the term "substrate" may also embrace flexible substrates such as a web or a foil. The term "substantially inflexible" is understood to distinguish over "flexible". Specifically, a substantially inflexible substrate can have a certain degree of flexibility, e.g. a glass plate having a thickness of 0.9 mm or below, such as 0.5 mm or below, wherein the flexibility of the substantially inflexible substrate is small in comparison to the flexible substrates.

The contactless transportation may be a magnetic levitation system. In particular, the magnetic levitation system may be provided so that at least a part of the weight of a substrate carrier is carried by the magnetic levitation system. The substrate carriers can then be guided essentially contactlessly along a first substrate transportation track and/or a second substrate transportation track, respectively, through the in-line substrate processing system. In particular, the first substrate transportation track and the second substrate transportation track may each include a carrier holding structure and carrier driving structure. A carrier holding structure can be configured for a contactless holding of a substrate carrier. A carrier driving structure can be configured for a contactless translation of a substrate carrier, for example, a first substrate carrier or the second substrate carrier. A carrier holding structure may include a magnetic levitation system for contactless holding of a substrate carrier. Further, a carrier driving structure may include a magnetic drive system for contactless driving of a substrate carrier.

Figure 5:
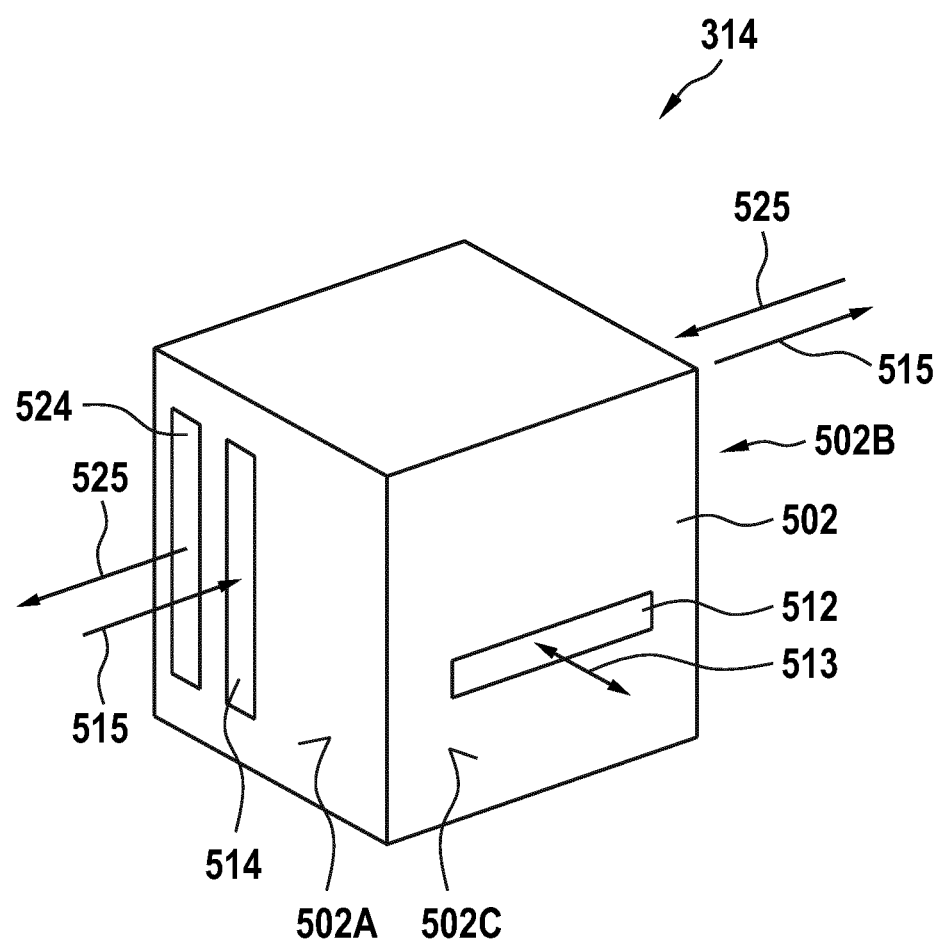
FIG. 5 shows a schematic view of a mask handling module for an in-line substrate processing system according to embodiments described herein.

FIG. 5 shows a vacuum orientation chamber 314. The vacuum orientation chamber can be a vacuum orientation chamber of the vacuum orientation module 120 shown in FIG. 2.

The vacuum orientation chamber includes a vacuum chamber 502. The vacuum chamber 502 includes side walls. The side wall 502A and the side wall 502B (not visible in FIG. 5) oppose each other. Further, side wall 502C is provided between the two opposing side walls. The vacuum orientation chamber is configured to change the substrate orientation between non-vertical orientation, for example, a horizontal orientation and a non-horizontal orientation, for example, a vertical orientation or essentially vertical orientation. An exemplary orientation actuator is shown in FIG. 6B.

The vacuum orientation module or a vacuum orientation chamber of the vacuum orientation module participates in transportation of a substrate in a substrate processing system. A substrate can be loaded into the vacuum orientation chamber or unloaded from the vacuum orientation chamber as indicated by arrow 513. For example, the substrate can be loaded from a load lock chamber or loaded into a load lock chamber along arrow 513. Loading and unloading is conducted in a non-vertical orientation, for example, a horizontal orientation. A slit opening 512, such as a horizontal slit opening, is provided in the further side wall 502C of the vacuum chamber 502.

According to some embodiments, which can be combined with other embodiments described herein, the substrate may enter the vacuum chamber 502 at the first slit opening 514. For example, the slit opening 514 can be provided at the side wall 502A. The substrate can exit the vacuum chamber 502 at the side wall 502B. According to some embodiments, which can be combined with other embodiments described herein, moving a substrate into the vacuum chamber 502 and out of the vacuum chamber can be conducted on opposing sides of the vacuum chamber, i.e. opposing side walls. A transportation track (not shown in FIG. 5) is provided between the two slit openings at opposing side walls of the vacuum chamber. The movement of the substrate is indicated by arrows 515. For embodiments of the present disclosure, a substrate can be transported on a substrate carrier according to embodiments described herein.

According to embodiments of the present disclosure, the two slit openings at the opposing side walls are vertical or essentially vertical. A substrate can be transported through the vacuum chamber 502 along the bidirectional transportation direction in an essentially vertical orientation. Vacuum swing modules according to the state of the art typically have a horizontal slit opening at one side of the vacuum swing module and have a vertical slit opening at an opposing side of the vacuum swing module. Accordingly, a substrate can be horizontally loaded in a portrait orientation with a robot or the like. The substrate is rotated along the substrate's longer side, i.e. the length of the substrate, and is transported out of the vacuum swing module in a vertical orientation and with a landscape orientation. Embodiments of the present disclosure provide a horizontal loading of the substrate in a landscape orientation, for example, through slit opening 512 at the side wall 502C, i.e. the side wall between the two opposing side walls. The horizontal loading in a landscape orientation is counter-intuitive and would generally need to be avoided. However, the benefits with respect to mask handling, the footprint of substrate processing system, and tact time motivate a deviation from the horizontal portrait handling.

According to one embodiment of the present disclosure, a vacuum orientation module for a substrate processing system is provided. The vacuum orientation module includes at least a first vacuum orientation chamber, e.g. vacuum orientation chamber 314 shown in FIG. 5 and in FIG. 3. The vacuum orientation chamber 315 shown in FIG. 3 can be provided similar to the vacuum orientation chamber 314. The vacuum orientation chamber includes a vacuum chamber and a transportation track within the vacuum chamber, the transportation track having a support structure and a driving structure and defines a bi-directional transportation direction. An orientation actuator is provided to change the substrate orientation between a non-vertical orientation and a non-horizontal orientation. According to some embodiments of the present disclosure, the vacuum chamber has a two slit openings at opposing side walls of the vacuum chamber in the bi-directional direction. For example, the two slit openings may include the first slit opening 514 and the further slit opening not shown in FIG. 5. The opposing side walls can be side wall 502A and side wall 502B.

According to some embodiments, a non-vertical slit opening, for example, horizontal slit opening 512 shown in FIG. 5 can be provided for the at least first vacuum orientation chamber. The slit opening 512 can be provided for loading and unloading of the substrates. According to yet further embodiments, which can be combined with other embodiments described herein, a second vacuum orientation chamber can be provided in a substrate processing system, as illustrated in FIG. 3. The second vacuum orientation chamber is aligned with the at least first orientation chamber along the in-line direction of the substrate processing system. Particularly, one or vertical slit openings of the second vacuum orientation chamber and the at least first vacuum orientation chamber can be aligned.

According to some embodiments, which can be combined with other embodiments described herein, slit openings in the vacuum chamber of the vacuum orientation chamber according to embodiments described herein can be provided with the slit valve. The slit valve can be provided to seal the vacuum chamber in a vacuum tight manner. Particularly the horizontal slit opening 512 can be provided with a slit valve. According to yet further optional embodiments, also the slit opening 514 and/or the slit opening opposing the slit opening 514 can be provided with a slit valve.

According to an embodiment, the vacuum orientation module is provided. The vacuum orientation module includes at least a first vacuum orientation chamber. The at least first vacuum orientation chamber includes a vacuum chamber and a transportation track within the vacuum chamber, the transportation track having a support structure and a driving structure. Further, an orientation actuator to change the substrate orientation between a non-vertical orientation and a non-horizontal orientation is provided. The orientation actuator moves the substrate by an angle and around an axis located between a first end of the substrate and a second end of the substrate, wherein the second end opposes the first end.

Figure 6A:
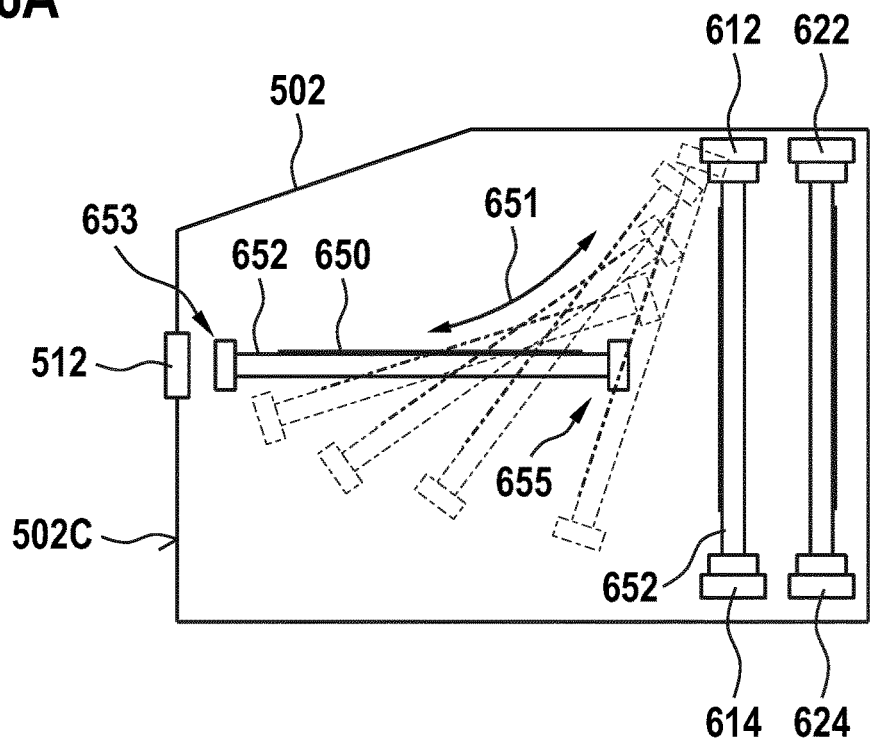
FIGS. 6A and 6B show schematic cross-sectional side views of a mask handling module for an in-line substrate processing system according to embodiments described herein.
Figure 6B:
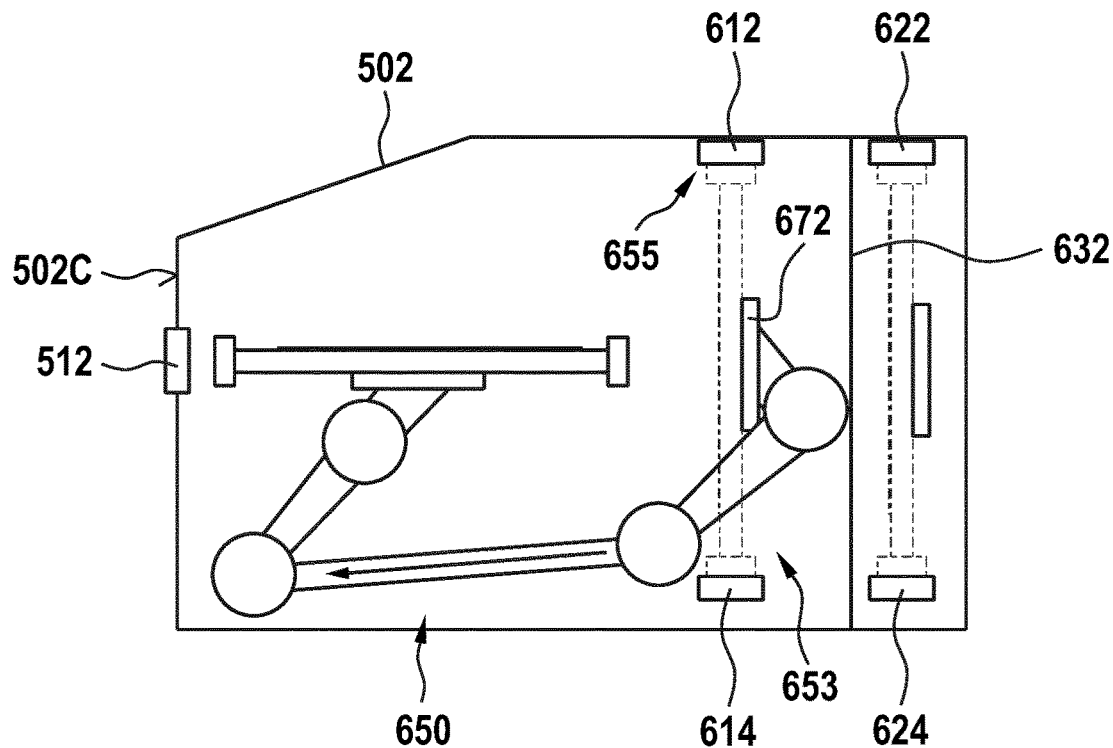

For example, FIGS. 6A and 6B illustrate a vacuum orientation chamber having a vacuum chamber 502. A slit opening 512 is provided at a side wall 502C of the vacuum chamber 502. A substrate 650 can be loaded onto a carrier 652 through the slit opening 512. The carrier 652 can be a substrate carrier according to embodiments described herein. For example, the carrier can be an electrostatic chuck. After loading the substrate 650 on the carrier 652 in the non-vertical orientation, for example, a horizontal orientation shown in FIG. 6A, the substrate can be moved as indicated by arrow 651. The substrate is moved, for example, from the horizontal orientation in a vertical orientation or an essentially vertical orientation and towards a transportation track for transporting of the substrate or the carrier having the substrate, respectively.

According to some embodiments, which can be combined with other embodiments described herein, the transportation track can be provided by a magnetic levitation system. For example, the support structure 612 can be provided above the carrier 652 and driving structure 614 can be provided below the carrier 652. The support structure 612 can be a magnetic bearing having, for example, one or more electromagnets to levitate the carrier 652.

The driving structure 614 can be a magnetic drive having, for example, one or more electromagnets to drive the carrier 652 along a transportation direction. For example, the carrier can be moved as indicated by arrows 515 shown in FIG. 5.

The movement of the carrier from the horizontal orientation to the essentially vertical orientation can be provided by an orientation actuator, for example, orientation actuator 660 shown in FIG. 6B. As exemplarily indicated by arrow 651 in FIG. 6A, the orientation actuator is configured to move the substrate away from the transportation track in the non-vertical orientation, i.e. the horizontal orientation. Accordingly, when supporting the carrier 652 in the horizontal orientation, the space between the support structure 612 and the driving structure 614 is empty. Another carrier with another substrate can move through the vacuum chamber 502 as exemplarily indicated by arrows 515 in FIG. 5 while a carrier 652 is in a horizontal orientation in the vacuum chamber 502. According to some embodiments, which can be combined with other embodiments described herein, the transportation track can be available for a second carrier while having a first carrier in the non-vertical (horizontal) orientation. Accordingly, a vacuum orientation chamber according to embodiments of the present disclosure allows to have at least two substrates in the vacuum chamber 502. Particularly, the first substrate can be supported in a horizontal orientation and a second substrate can be supported between a first support structure 612 and the first driving structure 614. Embodiments of vacuum orientation chambers, according to embodiments described herein, allow for increasing the tact time in a substrate processing system by providing two or more vacuum orientation chambers in a vacuum orientation module.

As for example shown in FIG. 3, the first vacuum orientation chamber 314 can be provided and a second vacuum orientation chamber 315 can be provided. Moving of substrates between non-vertical and non-horizontal orientations can be provided, for example, alternatingly in the two vacuum orientation chambers. An essentially vertically oriented substrate can be moved from the first vacuum orientation chamber 314 through the second vacuum orientation chamber 315 towards the first deposition module. Simultaneously, a further substrate can be loaded on a further carrier in the second vacuum orientation chamber 315. In light of the fact that the orientation actuator in the vacuum chamber provides an empty transportation track between the support structure 612 and the driving structure 614 while substrates are loaded horizontally on a carrier, the substrate moving from the first vacuum orientation chambers 314 towards the first deposition module can utilize the empty transportation track. Such a movement is schematically illustrated by arrows 515 in FIG. 5. A vacuum orientation module according to embodiments described herein advantageously allows for increasing the tact time. For example, having two vacuum orientation chambers operating simultaneously, the tact time can be essentially doubled.

FIG. 6B illustrates yet further details of an orientation actuator 660 according to embodiments of the present disclosure. An orientation actuator 660 includes a support 672 for supporting a carrier 652. The carrier includes a first end 653 and a second end 655 opposing the first end 653. The support 672 is configured to support the carrier 652 between the first end 653 and the second end 655. Particularly, the support 672 can be configured to support the carrier at or close to the center of the carrier, i.e. the center between the first end 653 and the second end 655. According to some embodiments, which can be combined with other embodiments described herein, an orientation actuator is configured to change the substrate orientation between a non-vertical orientation and a non-horizontal orientation, the orientation actuator moving the substrate by an angle and around an axis located between a first end of the substrate and a second end of the substrate, the second end opposing the first end.

Supporting the carrier at or proximate to the center allows for a movement of the carrier away from the transportation track while moving the carrier from the essentially vertical orientation in the horizontal orientation.

According to some embodiments, which can be combined with other embodiments described herein, the movement of the carrier between the two orientations can include a movement by an angle and a translation as indicated by the arrow in FIG. 6B.

Figure 7A:
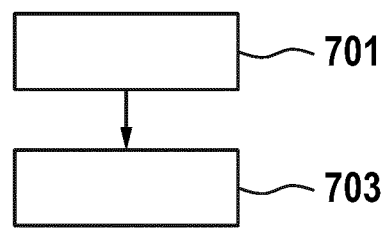
FIGS. 7A and 7B show a flowchart illustrating methods of transporting a substrate, e.g. a large area substrate in a substrate processing system according to embodiments described herein.
Figure 7B:
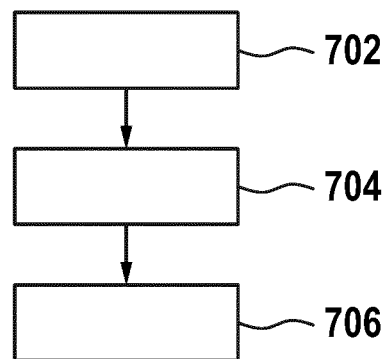

FIGS. 7A and 7B illustrate embodiments of methods of transporting a large area substrate having a length and a width shorter than the length in a substrate processing system or a corresponding method of manufacturing a layer stack of a display and including the transportation methods. A method can include loading the large area substrate into a vacuum orientation chamber in a non-vertical orientation with a movement parallel to the width of the large area substrate, as indicated by operation 701 (see FIG. 7A). Accordingly, the substrate is horizontally loaded at a landscape orientation. At operation 703, the large area substrate is moved from the non-vertical orientation of the substrate to a non-horizontal orientation, e.g. with an orientation actuator provided in the vacuum chamber.

Additionally or alternatively, a method includes operation 702, i.e. moving the large area substrate into at least a first vacuum orientation chamber having a vacuum chamber through a first slit opening at a first side wall of the vacuum chamber. For example, this may be the essentially vertical slit opening 514 shown in FIG. 5. At operation 704, the large area substrate is moved out of the at least first vacuum orientation chamber through a second slit opening at the second side wall of the vacuum chamber, the second side will oppose the first side wall. For example, this may be a slit opening at side wall 502B (not visible in FIG. 5). Further, at operation 706, the large area substrate is moved from a non-vertical orientation of the substrate to a non-horizontal orientation or vice versa in the at least first vacuum orientation chamber.

According to yet further embodiments, a method of manufacturing a layer stack for display on a large area substrate may include one or more of the transportation methods described above and may further include depositing one or more layers of a layer stack for display. For example, layers can be deposited in a first deposition module, for example, an organic deposition module. Additionally or alternatively, layers can be deposited in a second deposition module, for example, the metallic deposition module.

Yet further embodiments of vacuum orientation module for a substrate processing system can be described with respect to FIGS. 2, 3, 5, 6A, and 6B. As described above, a substrate may be loaded in the substrate processing system 100 through a load lock module 112. The substrate can be moved in the vacuum orientation module in a horizontal orientation. According to some embodiments, which can be combined with other embodiments described herein, the substrate can be loaded on a substrate carrier in a horizontal orientation. Further, the carrier supporting the substrate can be moved by an angle to change the substrate orientation from a horizontal orientation to a non-horizontal orientation. Thereafter, the substrate can be moved to a mask handling module 120 and a first deposition module 130. After deposition in the first deposition module 130, for example, an organic deposition module, a mask that has previously been provided at the substrate in the mask handling module can be removed in the mask handling module. A carrier supporting the substrate is moved through the glass handling module 110 towards the second deposition module 160. For example, the carrier supporting the substrate can be moved in the second mask handling module 150, a mask can be provided at the substrate, and a deposition process can be provided in the second deposition module, for example, the metallic deposition module. After processing in the second deposition module 160, the mask can be removed in the mask handling module 150. The substrate orientation can be changed from the non-horizontal orientation, i.e. an essentially vertical orientation, to a horizontal orientation in a vacuum orientation chamber and can be unloaded from the substrate processing system 100 through the load lock module. According to some embodiments, which can be combined with other embodiments described herein, the number of load lock chambers in the load lock module 112 can correspond to the number of vacuum orientation chambers in a vacuum orientation module 114.

As described above, a transfer from the first deposition module 130 to the second deposition module 160 include a transfer through the glass handling module 110. Accordingly, a vacuum orientation module for a substrate processing system includes at least a first vacuum orientation chamber. The at least first orientation chamber includes a vacuum chamber and a first transportation track within the vacuum chamber, the first transportation track having a first support structure and a first driving structure defining a bi-directional transportation direction. The first support structure can be a support structure 612 shown in FIG. 6A and the first driving structure can be driving structure 614 shown in FIG. 6A. An orientation actuator 660 can be provided. According to some embodiments, an orientation actuator is configured to change the substrate orientation between a non-vertical orientation and a non-horizontal orientation, the vacuum chamber has a first pair of two slit openings at opposing side walls of the vacuum chamber in the bi-directional direction. According to some embodiments of the present disclosure, which can be combined with other embodiments described herein, a second transportation track within the vacuum chamber is provided. The second transportation track includes a second support structure and a second driving structure extending along the bi-directional transportation direction. The vacuum chamber has a second pair of two slit openings at the opposing side walls of the vacuum chamber.

The second transportation track can be provided by the second support structures 622 and the second driving structure 624 shown in FIG. 6A. Vertical slit openings can be provided in opposing side walls of the vacuum chamber 502 for transportation along the second transportation track. For example, FIG. 5A shows slit opening 524 at side wall 502A. A second slit opening corresponding to slit opening 524 can be provided at side wall 502B. Accordingly, a carrier supporting the substrate can be moved through the vacuum chamber 502 as indicated by arrows 525 in FIG. 5. The carrier supporting the substrate can be moved with the second drive structure 624 while being supported by the second support structure 622.

According to some embodiments, which can be combined with other embodiments described herein, the second transportation track is positioned, such that the first transportation track having first support structure 612 and first driving structure 614 is provided between the slit opening 512 and the second transportation track. As shown in FIG. 6B, according to some embodiments, which can be combined with other embodiments described herein, the first transportation track and the second transportation track can be separated by a separation wall 632. The separation wall 632 can provide separation between the first region of the vacuum chamber 502 and the second region of the vacuum chamber 502. Accordingly, the separation wall 632 may separate two vacuum regions that are pumped individually, for example, with two vacuum pump systems. Alternatively, the two regions may be evacuated by a common vacuum pump system. Irrespective of the presence of a separation wall, a horizontal distance between the first transportation track and the second transportation track can be, for example, 20 cm or above and/or can be 100 cm or below. For example, a distance between the transportation tracks can be about 50 cm.

According to some embodiments, which can be combined with other embodiments described herein, a second vacuum orientation chamber can be aligned with the first vacuum orientation chamber, such that the second slit opening 524 at side wall 502A is aligned with the further slit opening at side wall 502B. In light of the above, a substrate processing system can be provided. The substrate processing system includes a first deposition module being a first in-line module and having a first plurality of vacuum deposition sources and a second deposition module being a second in-line module and having a second plurality of vacuum deposition sources. The substrate processing system further includes a glass handling module between the first deposition module and the second deposition module, the glass handling module comprises a vacuum orientation module according to any of the embodiments described herein. Particularly, the vacuum orientation module may have a second transportation track. According to yet further additional or alternative modifications, the vacuum deposition module may include a first vacuum orientation chamber and a second vacuum orientation chamber, each having a second transportation track.

In light of the above, one or more of the following advantages can be provided by embodiments of the present disclosure. The mask handling can be improved. Particularly a mask return path can be avoided. Further mask transport can be provided in the vacuum processing system to avoid contamination of a mask or a mask carrier. Further, substrate carrier transport can also be provided, with the exception of replacement or cleaning, in the vacuum processing system to avoid contamination of a substrate carrier. The footprint of the substrate processing system can be reduced by folding of the deposition modules and avoiding return paths for mask and/or substrate carriers. Embodiments allow for having two or more vacuum orientation chambers working simultaneously in the vacuum processing system to increase the tact time of the vacuum processing system. Further, a separation of an organic deposition module and a metallic deposition module can be provided to allow for individual masking for the different deposition modules. Yet further, the above described advantages, which apply to one deposition module, can be provided for both deposition modules.

While the foregoing is directed to some embodiments, other and further embodiments may be devised without departing from the basic scope, and the scope is determined by the claims that follow.

The invention claimed is:

1. A substrate processing system for processing of a plurality of substrates, comprising:
   a first deposition module being a first in-line module and having a first plurality of vacuum deposition sources;
   a second deposition module being a second in-line module and having a second plurality of vacuum deposition sources; and
   a glass handling module between the first deposition module and the second deposition module, the glass handling module comprising a vacuum orientation module and a load lock module, wherein the vacuum orientation module is configured to change a substrate orientation from a non-vertical orientation to a non-horizontal orientation under vacuum, and wherein the substrate is loaded into and unloaded from the load lock module in a horizontal orientation.

2. The substrate processing system according to claim 1, wherein the vacuum orientation module comprises:
   a first vacuum orientation chamber; and
   a second vacuum orientation chamber.

3. The substrate processing system according to claim 1, wherein the load lock module is configured for horizontally loading and unloading the glass-substrates between an atmospheric region and vacuum in the substrate processing system.

4. The substrate processing system according to claim 1, further comprising at least one of:
   a first mask handling module between the glass handling module and the first deposition module; and
   a second mask handling module between the glass handling module and the second deposition module.

5. The substrate processing system according to claim 4, wherein at least one of the first mask handling module and the second mask handling module comprises:
   a vacuum rotation chamber; and
   a mask handling chamber connected to the vacuum rotation chamber.

6. The substrate processing system according to claim 5, wherein the vacuum rotation chamber comprises:
   a first mask stage and a second mask stage, the vacuum rotation chamber being configured to exchange a position between the first mask stage and the second mask stage.

7. The substrate processing system according to claim 1, further comprising at least one of:
   a first vacuum rotation chamber provided at an end of the first deposition module distant to the glass handling module; and
   a second vacuum rotation chamber provided at an end of the second deposition module distant to the glass handling module.

8. The substrate processing system according to claim 4, wherein at least one of the first mask handling module and the second mask handling module comprises an organic deposition path.

9. The substrate processing system according to claim 4, wherein at least one of the first mask handling module and the second mask handling module comprises a metallic deposition path.

10. The substrate processing system according to claim 5, wherein the vacuum rotation chamber comprises a rotation mechanism including a rotating support.

11. The substrate processing system according to claim 10, wherein the rotation mechanism comprises an actuator configured to rotate the rotating support within the vacuum rotation chamber.

12. The substrate processing system according to claim 1, wherein the substrate orientation can be changed from the horizontal orientation, to a vertical orientation.

* * * * *